United States Patent
Tang et al.

(10) Patent No.: US 6,903,984 B1
(45) Date of Patent: Jun. 7, 2005

(54) FLOATING-BODY DRAM USING WRITE WORD LINE FOR INCREASED RETENTION TIME

(75) Inventors: Stephen Tang, Pleasanton, CA (US); Ali Keshavarzi, Portland, OR (US); Dinesh Somasekhar, Portland, OR (US); Fabrice Paillet, Hillsboro, OR (US); Muhammad Khellah, Lake Oswego, OR (US); Yibin Ye, Portland, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/748,222

(22) Filed: Dec. 31, 2003

(51) Int. Cl.[7] ................................................. G11C 7/00
(52) U.S. Cl. .............. 365/189.09; 365/149; 365/189.01
(58) Field of Search ............................ 365/189.09, 149, 365/189.01

(56) References Cited

U.S. PATENT DOCUMENTS 5,877,978 A * 3/1999 Morishita et al. ........... 365/149

6,341,087 B1 * 1/2002 Kunikiyo ................ 365/189.09

OTHER PUBLICATIONS

Takashi Ohsawa et al. "Memory Design Using One-Transistor Gain Cell on SOI," ISSCC 2002, Session 9, Dram and Ferrorelectric Memoirs.

* cited by examiner

Primary Examiner—Huan Hoang
(74) Attorney, Agent, or Firm—Fleshner & Kim, LLP

(57) ABSTRACT

A DRAM memory cell uses a single transistor to perform the data storage and switching functions of a conventional cell. The transistor has a floating channel body which stores a potential that corresponds to one of two digital data values. The transistor further includes a gate connected to a first word line, a drain connected to a second word line, and a source connected to a bit line. By setting the word and bit lines to specific voltage states, the channel body stores a digital one potential as a result of impact ionization and a digital zero value as a result of forward bias of body-to-source junction.

30 Claims, 11 Drawing Sheets

|  | DRAIN (WRITE WORD LINE) | GATE (WORD LINE) | SOURCE (BIT LINE) |
|---|---|---|---|
| HOLD | LOW | VERY LOW (ACCUMULATED) | LOW |
| ROW WRITE 1 (IMP. ION. ON) | HIGH | HIGH | LOW |
| KEEP1/WRITE0 (DIODE OFF/ON) | LOW | MEDIUM TO LOW | LOW/VERY LOW |

*FIG. 11*

|  | DRAIN (WRITE WORD LINE) | GATE (WORD LINE) | SOURCE (BIT LINE) |
|---|---|---|---|
| HOLD | HIGH | VERY HIGH (ACCUMULATED) | HIGH |
| ROW WRITE 1 (IMP. ION. ON) | LOW | LOW | HIGH |
| KEEP1/WRITE0 (DIODE OFF/ON) | HIGH | MEDIUM TO HIGH | HIGH/ VERY HIGH |

…

FLOATING-BODY DRAM USING WRITE WORD LINE FOR INCREASED RETENTION TIME

BACKGROUND OF THE INVENTION

1. Field of the Invention

This invention relates to memory circuits, and more particularly to a memory cells formed from floating-body transistors and their applications.

2. Description of the Related Art

Integrating memory circuits (e.g., caches) on microprocessor dies is a power efficient way of achieving higher performance. In fabricating these dies, a direct correlation exists between memory cell density and performance; that is, performance generally increases with the number of cells in the memory. The degree of integration that can be achieved is not limitless and most often is constrained by memory type, the limited die space available for accommodating the memory circuits, and manufacturing costs as well as other practical considerations.

One memory type that has been proposed for integration onto a microprocessor die is SRAM memory. When implemented in large caches, each SRAM memory cell uses six transistors to read and write the data therein. This six-transistor configuration consumes considerable die space and thus leads to low memory cell density. This, in turn, places a significant limitation on microprocessor system performance, and for at least these reasons using SRAM cells to fabricate on-die caches is considered to be less than optimal.

Another memory type proposed for integration onto a microprocessor die is DRAM memory. As shown in FIG. 1, a conventional DRAM cell uses one transistor T and one capacitor C to control the storage of data therein. Switching of the transistor is controlled by the voltage state of a word line WL and data is conveyed along a bit line BL via a sense amplifier. Because fewer components are used, an on-die cache formed from this so-called 1T/1C structure has far greater cell density and data storage capacity than SRAM memory. In fact, DRAM cells can be ten times smaller in area compared with SRAM cells. For this reason, DRAM has been favored by chip designers over other types of memory for forming caches on microprocessor dies.

While they are favored, conventional DRAM caches are not without drawbacks. For example, the switching transistor and storage capacitor in each cell are implemented as separate elements. This necessarily reduces the cell density of the memory, which has an adverse affect on system integration and performance. Also, costly processing steps are required to make a capacitor in each cell that can store enough charge to maintain reasonable refresh times (e.g., typically at least 25 ff is needed).

A need therefore exists for a memory cell which has a higher density than other cells which have been proposed and which therefore may be relied on to improve, for example, the on-die integration of caches in microprocessor systems. A need also exists to construct a memory cell of this type at low cost using existing manufacturing technologies.

BRIEF DESCRIPTION OF THE DRAWINGS

FIG. 11 is a chart showing how data values may be written into the DRAM memory array.

DESCRIPTION OF THE PREFERRED EMBODIMENTS

Figure 1:
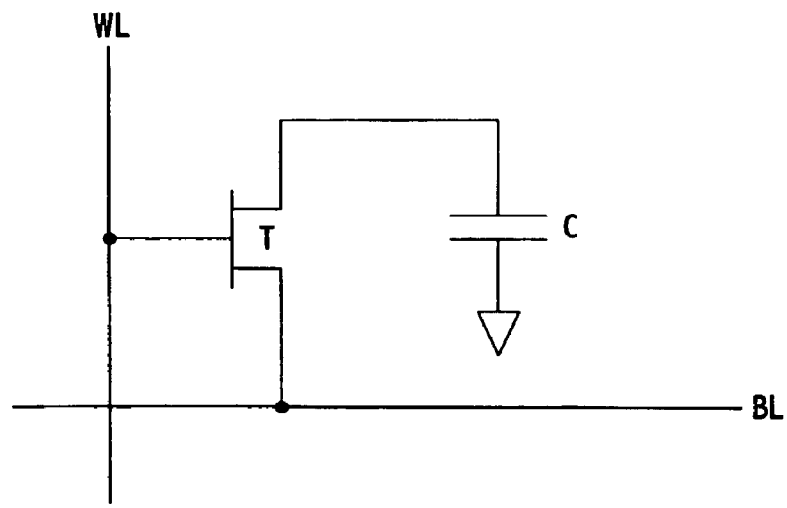
FIG. 1 is a diagram showing a DRAM cell having a so-called 1T/1C structure.
Figure 2:
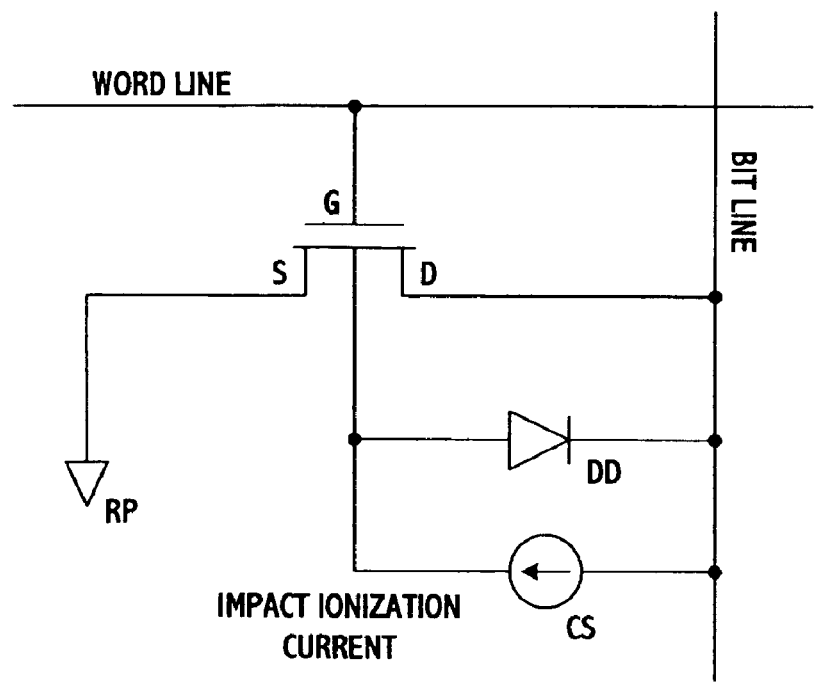
FIG. 2 is a diagram showing a first type of DRAM cell having a floating-body.

FIG. 2 is a diagram showing a first type of DRAM gain cell having a floating-body structure. The cell is formed from a single transistor having a source S connected to a reference potential RP (e.g., ground), a drain D connected to a bit line, and a gate G connected to a word line. A diode DD is provided to show a direction in which the drain junction is forward biased during a write '0" operation, and a current source CS is provided to show the direction in which impact ionization current flows when the transistor operates in a saturated operating region (i.e., when the drain voltage is greater than the gate voltage minus the threshold voltage, $V_g-V_T$) during a write '1" operation. As will become more apparent below, DD and CS are inherent to the transistor structure and are shown in FIG. 2 for explanatory purposes only.

Figure 3:
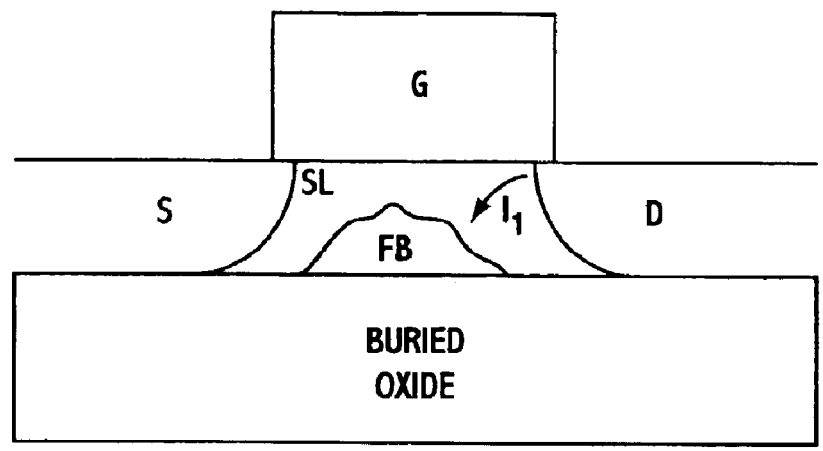
FIG. 3 is a diagram showing a cross-sectional view of the FIG. 2 cell which has a silicon-on-substrate structure.

The transistor has an silicon-on-insulator (SOI) structure which, as shown in FIG. 3, includes an insulating layer (e.g., $SiO_2$) formed on a silicon substrate S. A silicon layer SL is then formed over the insulating layer, and the gate is formed over the silicon layer with an intervening gate oxide film (not shown). When the silicon layer is made of p-type material, n-type diffusion regions are implanted into the silicon layer using known techniques to form the source and drain. The implantation process is controlled to ensure that the source and drain regions reach the underlying oxide layer and thus a channel is formed therebetween.

Depending on the thickness of the insulating layer, the channel region can be fully depleted or partially depleted. When the thickness of the insulating layer is smaller than the depletion depth, the transistor is in a fully depleted state.

That is, full depletion exists when the total depletion charge exceeds the possible depletion charge limited by the thickness of the insulating layer. Otherwise, the transistor is in a partially depleted state. The substrate may correspond to a die containing other cells and/or microprocessor circuits.

The insulating layer induces formation of area under the depletion region called a body B. (Because the body is not directly connected to a fixed potential, it is considered to be floating and therefore has been labeled FB for "floating body.") Because the floating body is formed in the silicon layer, it may be referred to as a p-type floating body. Alternatively, the floating body may be made of an n-type material and the source and drain diffusion regions made from a p-type material.

Figure 4:
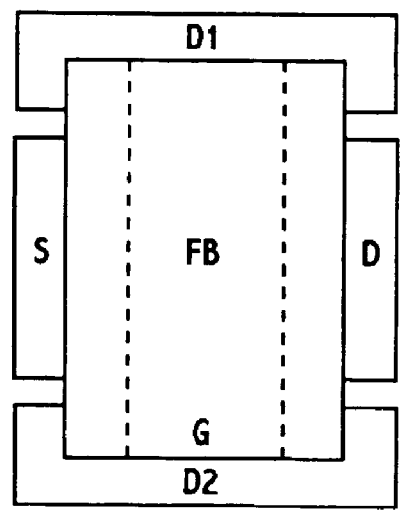
FIG. 4 is a diagram showing a top view of the FIG. 2 cell having the silicon-on-substrate structure.

The floating body is separated from the gate by the depletion region in the channel. If desired, lightly doped n-type regions (not shown) may be included under the gate and over the depletion region on either side of the channel. When arranged in this manner, the floating body is completely isolated by the insulating layer. As shown in FIG. 4, a pair of doped regions D1 and D2 may be aligned along the end portions of the floating body. These regions may be p-type bodies which make electrical connection to the floating body and thus allow electrical contacts to be formed.

Figure 5:
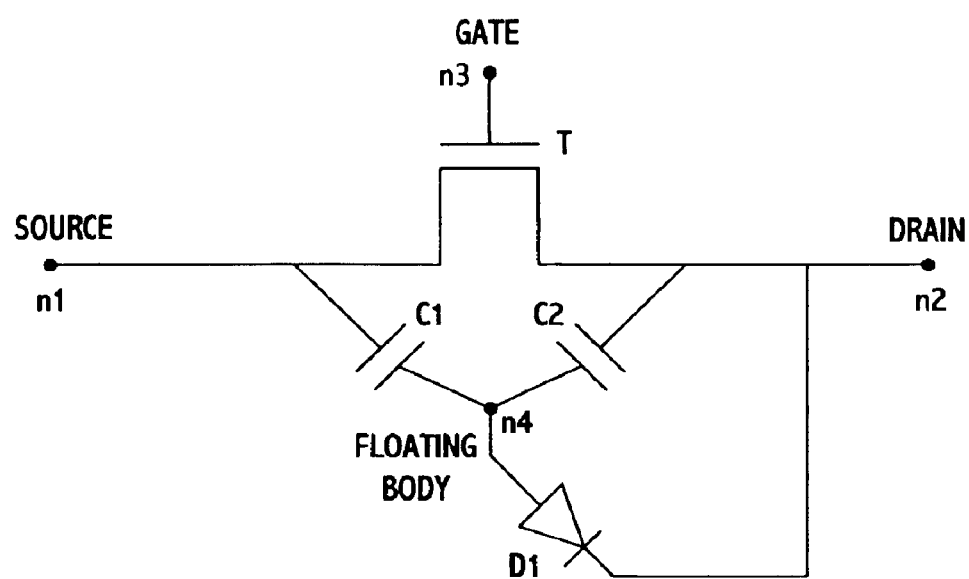
FIG. 5 is an equivalent circuit diagram of internal circuits formed by the SOI structure of the FIG. 2 DRAM cell.

FIG. 5 is an equivalent circuit diagram of internal circuits formed by the SOI structure of the DRAM cell. In this diagram the source, drain, and gate form a transistor T having corresponding nodes n1–n3, and the insulating layer induces formation of a virtual node n4 under the depletion region which corresponds to the channel body. A diode D1 is formed between node n4 and the drain and becomes forward biased when the voltage at n4 exceeds the drain voltage. In addition to these features, a gate-to-body capacitance exists and is relied upon for selecting the memory cell using word line and gate voltages. C1 and C2 represent source-to-body and drain-to-body parasitic capacitances which are considered undesirable.

In operation, the DRAM cell charges and discharges the channel body to produce a voltage at node n4 which correspond to a digital data value of "1" or "0." The amount of charge stored in the channel body thus determines the state of the cell. A more detailed discussion of the write and read operations for the cell now follows.

To write data in the cell, the body is either discharged by forward biasing the drain-to-body diode or charged by impact ionization current, respectively shown as DD and CS in the equivalent circuit diagram of FIG. 2. That is, to write '1"in the cell, the word line is asserted and then charge is pumped into the body by impact ionization current created by voltage on the bit line. Conversely, to write a '0" in the cell, the word line is reduced in voltage and the channel body is discharged when the drain diode is forward biased. A more detailed explanation of the internal operation of the cell during a write operation will now be given.

Figure 6A:
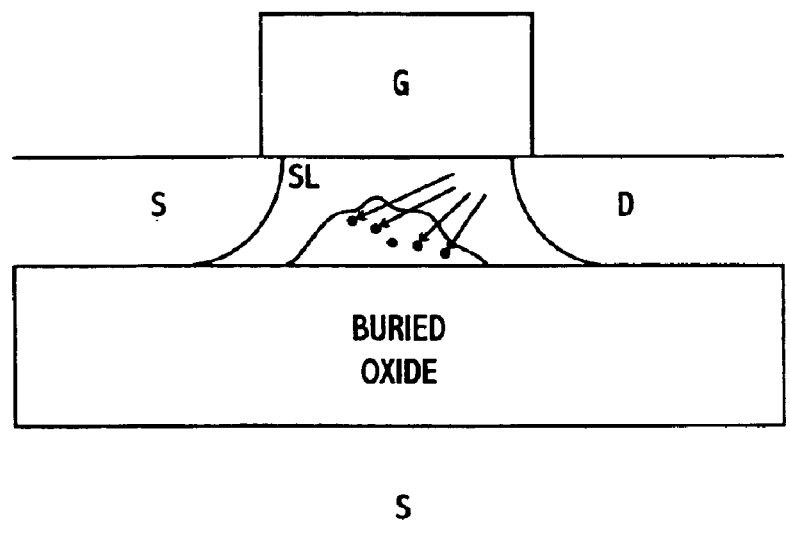
FIG. 6(a) is a diagram showing how the channel body of the transistor is charged during a write '1" operation.

Writing data into the cell is performed based on the accumulation of holes which serve as majority carriers in the floating channel body. When the gate voltage exceeds its threshold and the bit line assumes a digital "1" voltage, the transistor operates in the saturated region and impact ionization current begins to flow from an area near the drain. (See the current labeled $I_i$ in FIG. 3). Holes produced by the impact ionization current flow as majority carriers into the channel body, thereby developing a potential in the body which corresponds to digital "I." The migration of holes into the body which corresponds to this cell state is shown in FIG. 6(a), where the block dots are the holes.

Figure 6B:
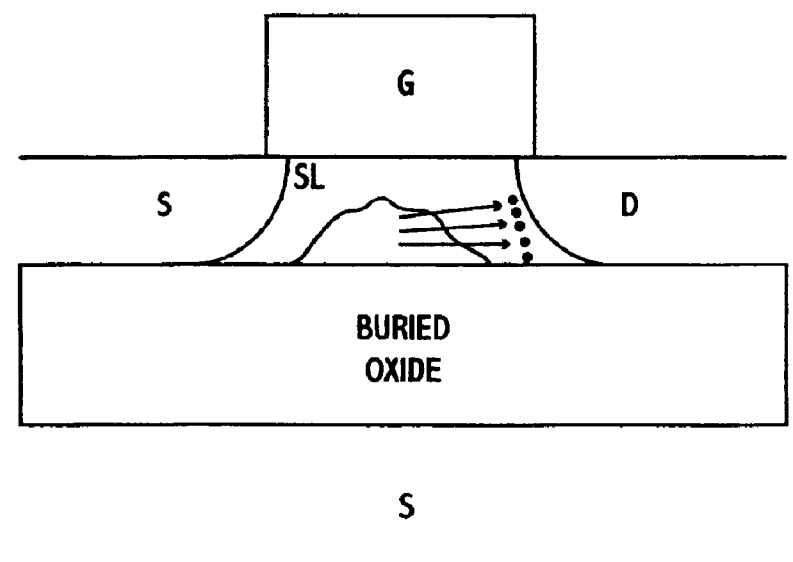
FIG. 6(b) is a diagram showing how this channel body is discharged during a write '0" operation.

When the gate voltage falls below its threshold and the bit line assumes a digital '0" value, the pn junction between the drain and the silicon layer is forward biased; that is, the body-to-drain diode DD is turned on. As a result, the holes in the body flow to the drain side of the transistor, thereby causing the body to develop a charge corresponding to digital data '0". The migration of holes to the drain side which produces this cell state is shown in FIG. 6(b).

Figure 7:
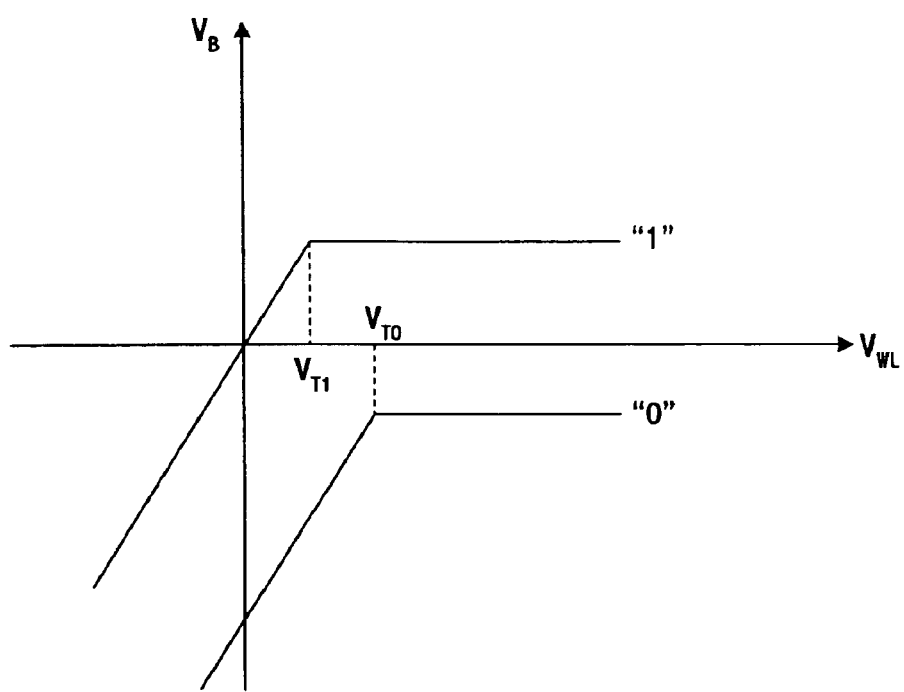
FIG. 7 is a diagram showing channel body potentials which correspond to different cell states.

A digital '1" or '0" is therefore stored as a difference in the potential of the channel body. As shown in FIG. 7, when the channel body assumes a higher potential $V_{T1}$ due to hole accumulation, the cell assumes a digital '1" state. And, when the channel body assumes a lower potential $V_{T0}$ due to the absence of holes, the cell assumes a digital '0" state. Here, $V_{WL}$ corresponds to the word line voltage connected to the gate. Note that when the cell is in a "1" state, the threshold voltage is lower than when in the "0" state; that is, $V_{T1}<V_{T0}$. Thus, the current of the cell in a "1" state is higher than when in a "0" state through the body effect.

In order to hold the '1"in the cell, a negative bias voltage may be applied to the word line to hold the accumulation of holes in the channel body. In theory, this data hold state is not changed even when a read operation is performed, as long as the read operation is performed in a linear region unless a write operation of inverted data (erase operation) is performed.

To read data from the cell, the body effect modulates the on-state current of the transistor. By detecting this current, the cell state (e.g., stored data), which is determined by the potential stored in the body, may be sensed. A read operation may therefore be performed by detecting a difference in bit line current when the bit line is clamped at a predetermined potential. The difference in bit line current under these conditions will determine whether a '1" or '0" is stored in the cell.

The aforementioned DRAM cell therefore uses a single element in the form of a floating body transistor to perform the functions of both a storage capacitor and switching transistor. By eliminating the need to use a separate storage capacitor, memories constructed from these cells can achieve higher densities compared with the conventional 1T/1C DRAM structure. This allows microprocessor chips having on-die caches to achieve a higher level of integration and performance. In the foregoing discussion, the DRAM cell is described as having an SOI structure. If desired, the cell may be implemented using bulk silicon technology using either floating n-wells or shallow-well technology.

Notwithstanding its improvements over the 1T/1C structure, the DRAM cell described above has a number of drawbacks. First, this cell requires a large gate-to-body coupling in order to properly select cells and prevent write disturbs. This means that gate-to-body capacitance should be the dominant component of overall body capacitance. This is true in SOI, where the buried oxide eliminates the substrate-to-body capacitance and the areal component of the source/drain-to-body capacitance, but this is not true when bulk silicon is used.

Second, when implemented using bulk silicon in a memory array, retention time of the floating body cell is extremely short because unselected cells suffer severe disturbs during a write operation. For example, a cell storing a digital '1" value partially discharges when another cell in the same column is written with a digital value of "0." Consequently, the cell storing the partially discharged '1" loses its state much sooner, which means it has a shorter retention time. These effects have been may be undesirable when attempting to construct a performance-efficient memory.

Figure 8:
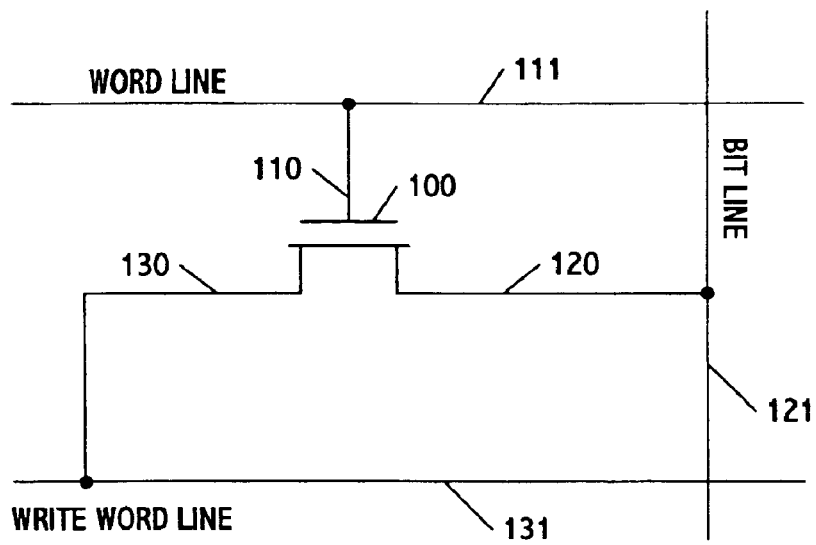
FIG. 8 is a diagram showing a second type of DRAM cell having a floating body structure implemented using SOI NMOS technology.

FIG. 8 shows a circuit diagram of a second type of DRAM gain cell having a floating-body structure. This cell is formed from a single transistor 100 having a gate 110 connected to a word line 111, a source 120 connected to a bit line 121, and a drain 130 connected to a third port 131 which runs parallel to the word line. The third port operates as a second word line which is used in conjunction with the first word line 111 to write data into the cell. For this reason, the second word line may be referred to as a write word line.

Figure 9:
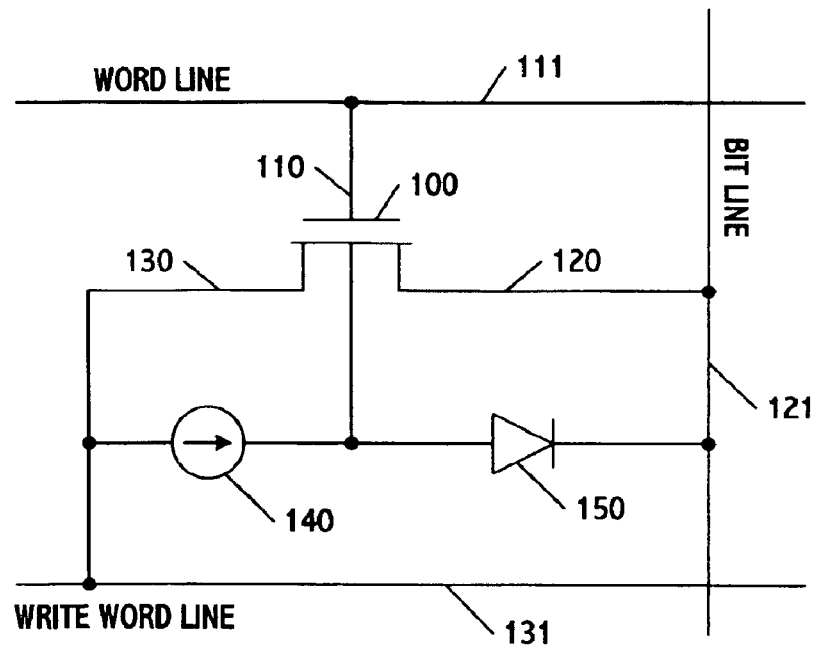
FIG. 9 is an equivalent circuit diagram of the second type of DRAM cell shown in FIG. 8.

An equivalent circuit diagram of the second type of cell is shown in FIG. 9. This diagram includes a virtual diode 140 which shows a direction in which the source junction is forward biased during a write '0" operation, and a virtual current source 150 which shows the direction in which impact ionization current flows when the write word, word, and bit lines are set to predetermined values during a write '1" operation. The diode and current source are inherent to the transistor structure and are shown in the equivalent circuit diagram for explanatory purposes only.

Connection of the write word line to the drain changes the electrical characteristics of the cell transistor compared with the FIG. 2 cell. As shown in the equivalent circuit diagram, impact ionization current 140 for charging the channel body is generated by increasing the voltage of the write word line. The channel body is discharged to a source side of the cell transistor line when diode 150 is forward biased.

To write data in the cell, the channel body of the transistor is either charged by impact ionization current or discharged by forward biasing the source-to-body diode. To write a digital value of '1"in the cell, the word and write word lines are asserted; that is, both word lines are raised to predetermined voltage states. This causes capacitive coupling to occur between the gate and channel body and also impact ionization current to flow, which results in charging the channel body of the transistor. More specifically, raising the voltage of the write word line causes impact ionization current to flow from an area near the drain into the channel body. As a result, holes produced by the impact ionization current migrate as majority carriers into the body, thereby charging the body to a potential which corresponds to a digital data value of "1." Unlike the FIG. 2 cell, the impact ionization current is therefore generated when the word and write word lines are asserted during a write '1" operation. (The source/write word line may therefore be said to act like a drain under these circumstances.)

To write a digital value of '0" in the cell, the voltage of the bit line is lowered to a value which is preferably below ground. This causes the virtual diode to become forward biased; that is, the channel body discharges when the holes migrate from the body to the source side of the transistor. The body therefore develops a charge (or lack thereof) which corresponds to a digital value of "0."

To read data from the cell, the aforementioned technique may be used. This involves detecting a difference in bit line current (caused by the body effect) when the bit line is clamped at a predetermined potential. The difference in bit line current under these conditions will determine whether a '1" or '0" is stored in the cell.

Figure 10:
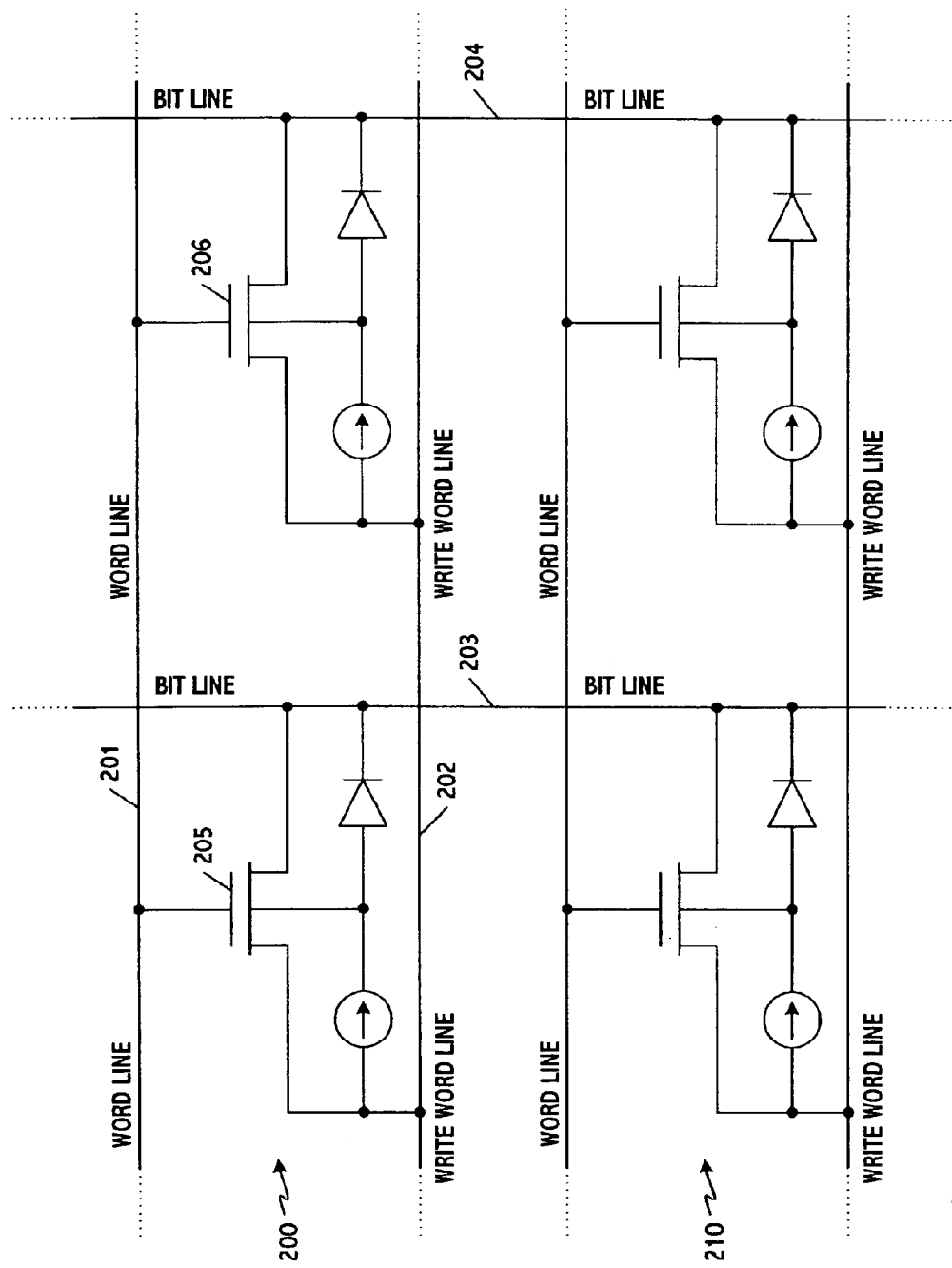
FIG. 10 is a diagram showing a partial view of a DRAM memory array formed from the second type of DRAM cells.

FIG. 10 shows a partial view of a memory array formed from the second type of memory cells, and FIG. 11 is a chart showing how data values may be written into these cells. A write operation is preferably performed on a row-by-row basis in two stages. In the first stage, all the cells in a first row 200 are written to the "11" state. This is accomplished by raising the voltages of word line 201 and write word line 202 to "high" voltage values. When this occurs, impact ionization current flows from the write word line (i.e., drain) into the channel body of each transistor in the row. The channel bodies therefore become charged to a voltage which corresponds to a digital value of "1." Bit lines 203 and 204 are kept in a low-voltage state at this time.

In the second stage, the cells which are to store a digital '0" are selectively altered by changing the voltages on their associated bit lines. For example, if a '0" value is to be stored in cell 206 but the value of '1" is to be retained in cell 205, the voltage on bit line 204 is lowered to a value below ground ("very low" in the chart) but the voltage on bit line 203 is maintained at "low." As a result, the body-to-source diode in cell transistor 206 becomes forward biased, thereby discharging the channel body in this transistor until the cell assumes a "0" value. Because the voltage of bit line 203 does not change (i.e., remains at "low") during this time, the write "0" operation performed on cell 206 does not affect cell 205. As a result, cell 205 retains storage of its "1" value and cell 206 stores a "0" value. The voltage of write word line 202 may transition to "low" (e.g., ground) and word line 201 transitions to "medium" or "low" during this time. This two-stage write process is then performed for row 210 and subsequent rows until all cells in the array have been written with appropriate values.

After a write operation is performed, the cells are in a hold (non-selected) state. To ensure that the data values stored therein are retained until a next read or a new write operation, the voltages of the word and bit lines are preferably set to the values corresponding to "hold" in the chart. More specifically, the write word line and bit lines are placed in a low voltage state and the word line is biased to a negative potential (e.g., a voltage below ground) which corresponds to a very low voltage state. Biasing the word line in this manner will result in setting the gate-to-source capacitance to the capacitance of the gate oxide film, which corresponds to a state in which no depletion layer is formed. In this state, the charge (or lack thereof) on the channel body is retained.

Figure 12:
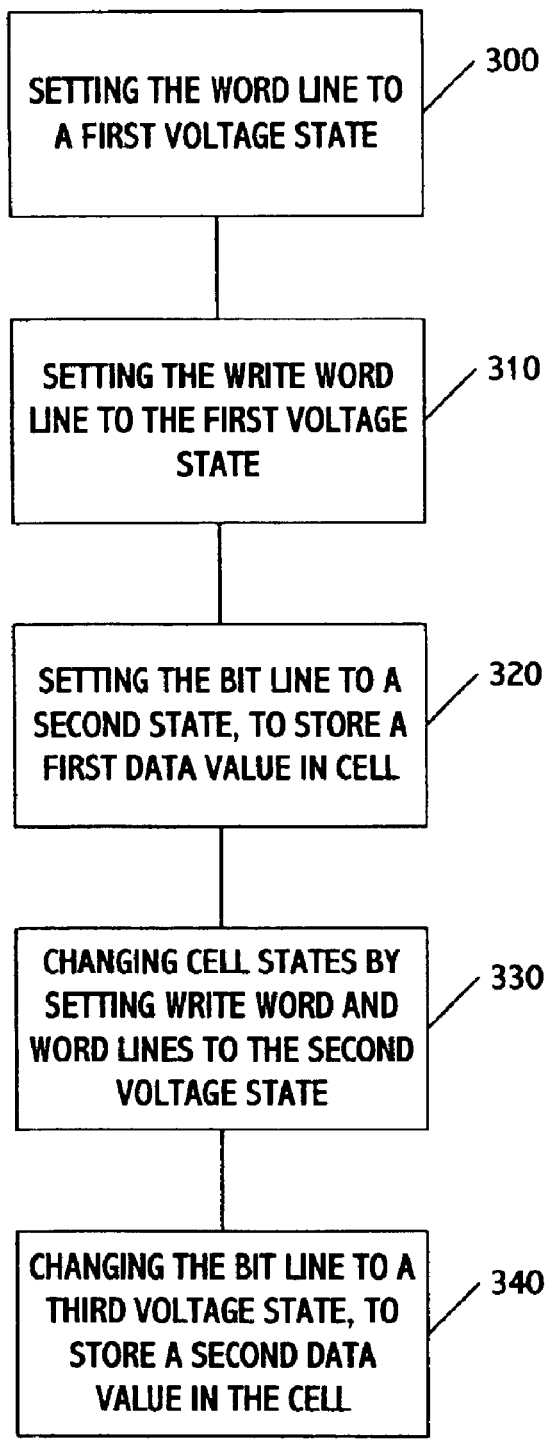
FIG. 12 is a flow diagram showing functional blocks included in a method for controlling the second type of DRAM cell.

FIG. 12 shows functional blocks that may be included in a method for controlling the second type of a DRAM cell when incorporated within a memory array. In an initial block, the word line connected to the transistor gate is set to a first voltage state. (Block 300). Then, the write word line connected to the source is set to a voltage state which preferably corresponds to the first voltage state. (Block 310). The bit line connected to the source is then set to a second voltage state. (Block 320). When implemented in NMOS, the first voltage state includes voltages which are higher than those in the second voltage state. The changing states of the write word, word, and bit lines may be set to these states simultaneously or in any desired order. Based on these states, the channel body of the cell assumes a potential which corresponds to a first digital data value, e.g., a digital value of "1."

To change the state of cell, the write word and word lines are set to the second voltage state. (Block 330). This may involve setting these lines to the same low value, or the word line may be set to a medium voltage value and the write word line to a low voltage value. The bit line is then set to a third voltage state, which is preferably a voltage lower than a voltage which corresponds to the second state. (Block 340). For example, the second state voltage may be a ground voltage and the third state voltage a negative voltage. Changing the word, write word, and bit lines to these states causes the channel body to assume a potential which corresponds to a second data value, e.g., a digital value of "0."

The write word line in the second type of memory cell therefore solves the selection problem in the FIG. 2 cell that arises as a result of inadequate gate-to-body capacitance. As previously discussed, in a memory array formed from FIG. 2 cells, strong voltages are used on the bit lines during a write operation and strong gate-to-body coupling is used to properly select cells and prevent disturbs from occurring in unselected rows in the same column. These measures are necessary to prevent severe disturbs from occurring in unselected cells, but require large amount of power consumption.

In the second type of cell, because the write word line addresses rows just like the word line, strong gate-to-body coupling is not necessary in order to properly select cells to be written. In effect, the write word line therefore takes the disturbing voltages from the bit line and hides them from unselected rows by presenting them only to the row to be written. By eliminating the write disturb problem, the write word line is able to substantially improve retention time. This, in turn, reduces the amount of bandwidth wasted by refresh and increases the bandwidth available for use in performing read and write operations. The overall functionality of the floating body DRAM cell is therefore substantially improved.

The second type of cell can also be manufactured using standard CMOS processes. This lowers the overall cost the: memory (an any associated on-die microprocessor system) and also makes the cell more scalable to future device technologies. This is because the cell uses a floating channel body to store data. This floating body does not have a fixed capacitor value that so many conventional circuits require. Instead of SOI, the second cell may also be implemented using bulk silicon technology which may prove to be preferable for many applications.

Figures 13, 14:
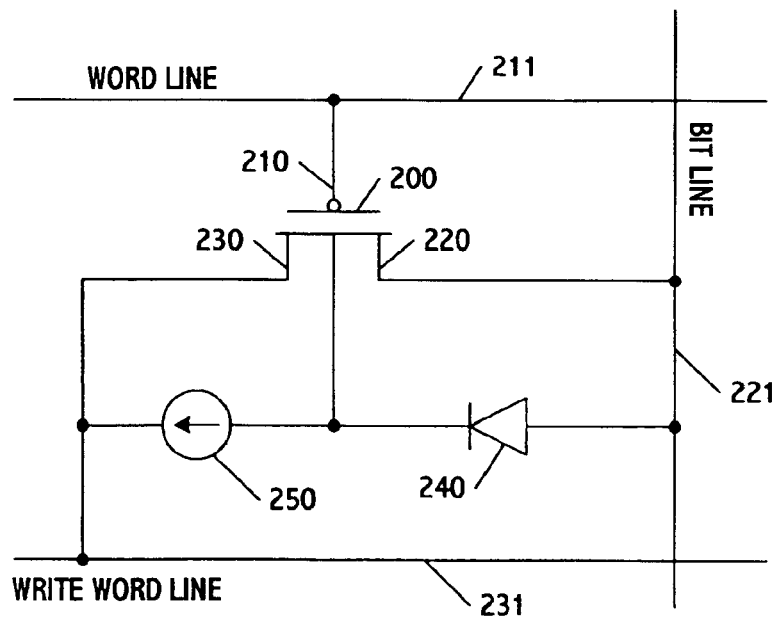
FIG. 13 is a diagram showing a PMOS implementation of the second type of DRAM cell.
FIG. 14 is a chart showing data values for controlling the PMOS cell of FIG. 13 in an array.

FIG. 13 shows an equivalent circuit diagram of the second type of data cell implemented in PMOS. This cell is formed from a single transistor 200 having a gate 210 connected to a word line 211, a source 220 connected to a bit line 221, and a drain 230 connected to a third port 231 which runs parallel to the word line. Like in the NMOS implementation, the third port operates as a second word line which is used in conjunction with the first word line 211 to write data into the cell. For this reason, the second word line may also be referred to as a write word line.

The cell also includes a virtual diode 240 which shows a direction in which the source junction is forward biased, and a virtual current source 250 which shows the direction in which impact ionization current flows. The diode and current source are inherent to the transistor structure and are shown in the equivalent circuit diagram for explanatory purposes only.

FIG. 14 shows an example of values which the write, write word, and bit lines may assume when the cell is used in a memory array. During a write "1" operation, the write word line (drain) and gate assume low voltage values and the bit line (source) assumes a high voltage value. During a write "0" operation, the write word line and bit line assume a high and very high voltage values respectively and the word line assumes a medium to high voltage. To retain a "1" value while the cell is being written with a "0," the bit line connected to another cell in the row may assume a very high value. To hold a value that has been written, the write word line and bit line assume high voltage values and the world line assumes a very high value. A reading operation may be performed based on sensing current differences on the bit line in a manner analogous to that previously described.

Figure 15:
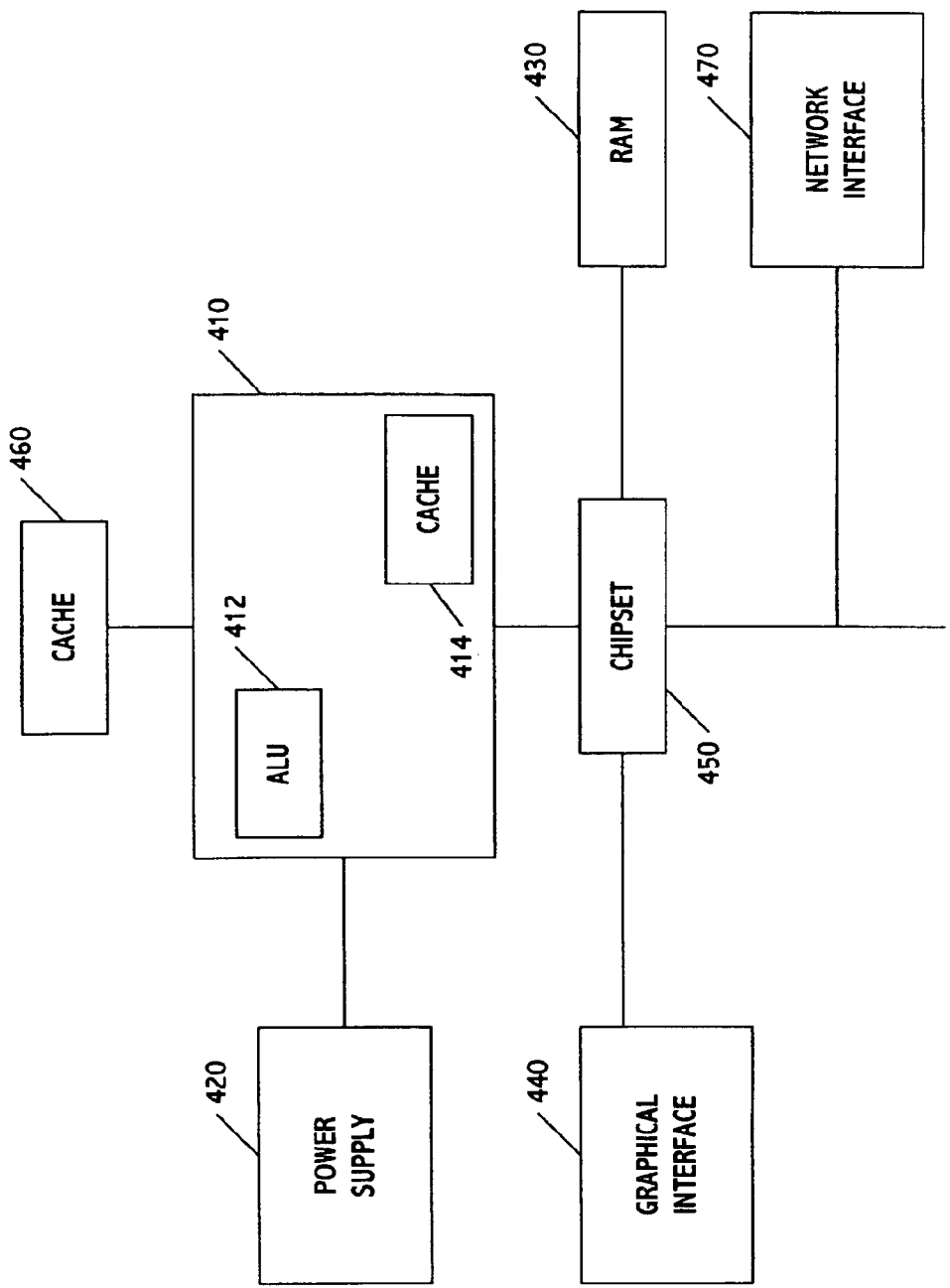
FIG. 15 is a diagram showing a processing system which includes one or more caches or other memory devices formed from any of the DRAM cells described herein.

FIG. 15 is a diagram showing a processing system which includes a processor 410, a power supply 420, and a memory 430 which, for example, may be a random-access memory. The processor includes an arithmetic logic unit 412 and an internal cache 414. The system also preferably includes a graphical interface 440, a chipset 450, a cache 460, and a network interface 470. The processor may be a microprocessor or any other type of processor. If the processor is a microprocessor, it may be included on a chip die with all or any combination of the remaining features, or one or more of the remaining features may be electrically coupled to the microprocessor die through known connections and interfaces. The internal cache 314, cache 360, and/or memory 330 may be formed from any of the floating body DRAM cells described herein. When implemented in this manner, the processing system is able to achieve improved performance over conventional devices.

The SOI structures described herein may be formed using any one of a variety of techniques including separation by implanted oxygen (SIMOX), zone melting and recrystallization (AMR), and bonded and etchback (BESOI) to name a few.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A memory cell, comprising:
a transistor having a floating channel body; and
a node to connect a drain of the transistor to a word line, said channel body having a potential which is determined based on a voltage state of the word line.

2. The memory cell of claim 1, wherein said potential corresponds to a first data value when the word line and a gate of the transistor is in a first voltage state and a source of the transistor is in a second voltage state.

3. The memory cell of claim 2, wherein the first voltage state of the word line causes impact ionization current to flow from an area near the drain to the channel body to create said potential.

4. The memory cell of claim 2, wherein the first data value is a digital one.

5. The memory cell of claim 2, wherein said potential changes to a second data value when the word line and gate assume the second voltage state and the source assumes a third voltage state.

6. The memory cell of claim 5, wherein forward bias current flows from the channel body to the source to create said potential corresponding to the second data value when the word line and gate assume the second voltage state and the source assumes the third voltage state.

7. The memory cell of claim 5, wherein the word line and gate assume different voltages values when in the second voltage state.

8. A memory cell, comprising:
a transistor having a floating channel body;
a first node to connect a source of the transistor to a bit line;
a second node to connect a gate of the transistor to a first word line;
a third node to connect a drain of the transistor to a second word line, wherein the channel body has a potential which is determined based on voltages of the bit line and first and second word lines, said potential corresponding to a data value stored in the cell.

9. The memory cell of claim 8, wherein said potential corresponds to a first data value when the first and second word lines assume a first voltage state and the bit line assumes a second voltage state.

10. The memory cell of claim 9, wherein the first voltage state of the first word line generates capacitive coupling between the gate and channel body and the first voltage state of the second word line causes impact ionization current to flow from an area near the drain into the channel body to create said potential corresponding to the first data value.

11. The memory cell of claim 9, wherein the first voltage state is greater than the second voltage state.

12. The memory cell of claim 9, wherein the first data value is a digital one.

13. The memory cell of claim 9, wherein said potential changes to a second data value when the first and second word lines assume a second voltage state and the bit line assumes a third voltage state.

14. The memory cell of claim 13, wherein the third voltage state generates forward bias current which flows from the channel body to the source to create said potential corresponding to the second data value.

15. The memory cell of claim 13, wherein, in the second voltage state, the first word line assumes a voltage different from the second word line.

16. The memory cell of claim 13, wherein, in the second voltage state, the first and second word lines assume substantially the same voltage.

17. The memory cell of claim 13, wherein the second data value is a digital zero.

18. A method for controlling a memory cell which includes a transistor having a floating channel body, a first node connecting a source of the transistor to a bit line, a second node connecting a gate of the transistor to a first word line, and a third node connecting a drain of the transistor to a second word line, said method comprising:
setting the first and second word lines to a first voltage state; and
setting the bit line to a second voltage state, wherein the channel body assumes a potential determined by the first and second voltage states, said potential corresponding to a first data value stored in the cell.

19. The method of claim 18, wherein capacitive coupling is generated between the gate and channel body when the first word line assumes the first voltage state, and wherein impact ionization current flows from an area near the drain into the channel body to create said potential when the second word line assumes the first voltage state.

20. The method of claim 19, wherein the first data value is a digital one.

21. The method of claim 19, further comprising:
setting the first and second word lines to the second voltage state; and
setting the bit line to a third voltage state, wherein said potential changes to a second data value the first and second word lines assume the second voltage state and the bit line assumes the third voltage state.

22. The method of claim 21, wherein the third voltage state generates forward bias current which flows from the channel body to the source to create said potential corresponding to the second data value.

23. The method of claim 21, wherein, in the second voltage state, the first word line assumes a voltage different from the second word line.

24. The method of claim 21, wherein, in the second voltage state, the first and second word lines assume substantially the same voltage.

25. The method of claim 21, wherein the second data value is a digital zero.

26. A method for controlling a memory having at least first and second cells, each of said cells including a transistor having a floating channel body, a first node connecting a source of the transistor to a different bit line, a second node connecting a gate of the transistor to a first common word line, and a third node connecting a drain of the transistor to a second common word line, said method comprising:
setting the first and second common word lines to a first voltage state; and
setting the bit lines to a second voltage state, wherein the channel bodies in the first and second cell transistors assume a potential determined by the first and second voltage states, said potential corresponding to a first data value.

27. The method of claim 26, further comprising:
changing the first and second common word lines to the second voltage state; and
changing the bit line connected to the first cell transistor to a third voltage state while maintaining the bit line of the second cell transistor at the second voltage state, wherein the channel body of the first cell transistor changes to a potential which corresponds to a second data value as a result of said changes.

28. The method of claim 27, wherein the first data value is a digital one and the second data value is a digital zero.

29. A system, comprising:
a processor; and
a memory cell including:
(a) a transistor having a floating channel body;
(b) a first node to connect a source of the transistor to a bit line;
(c) a second node to connect a gate of the transistor to a first word line;
(d) a third node to connect a drain of the transistor to a second word line, wherein the channel body has a potential which is determined based on voltages of the bit line and first and second word lines, said potential corresponding to a data value controlled by the processor.

30. The system of claim 29, wherein the processor and memory cell are located on a same chip.

* * * * *